(12) United States Patent
Sang et al.

(10) Patent No.: US 9,343,548 B1
(45) Date of Patent: May 17, 2016

(54) MANUFACTURING METHOD OF THIN FILM TRANSISTOR OF DISPLAY DEVICE

(71) Applicant: SAMSUNG DISPLAY CO., LTD., Yongin, Gyeonggi-do (KR)

(72) Inventors: Hyeon Jeong Sang, Bucheon-si (KR); Hee Young Lee, Suwon-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/749,722

(22) Filed: Jun. 25, 2015

(30) Foreign Application Priority Data

Nov. 28, 2014 (KR) .................. 10-2014-0169126

(51) Int. Cl.
*H01L 29/66* (2006.01)
*H01L 27/32* (2006.01)
(Continued)

(52) U.S. Cl.
CPC .... *H01L 29/66742* (2013.01); *H01L 21/28158* (2013.01); *H01L 21/32* (2013.01); *H01L 27/3262* (2013.01); *H01L 29/0649* (2013.01); *H01L 29/41733* (2013.01); *H01L 29/42384* (2013.01); *H01L 29/4908* (2013.01); *H01L 29/6675* (2013.01); *H01L 29/78675* (2013.01); *H01L 29/78696* (2013.01)

(58) Field of Classification Search
CPC ................. H01L 29/66742; H01L 29/78696; H01L 29/6675; H01L 29/78675; H01L 29/4908; H01L 29/42384; H01L 29/0649; H01L 21/28158; H01L 21/32; H01L 29/41733; H01L 27/3262
See application file for complete search history.

(56) References Cited

U.S. PATENT DOCUMENTS 8,426,865 B2 * 4/2013 Kwok .................. H01L 29/04
257/347
9,214,568 B2 * 12/2015 Kwok ............... H01L 29/78675

FOREIGN PATENT DOCUMENTS

CN 103762165 A * 4/2014
KR 10-2008-0003118 A 1/2008
(Continued)

OTHER PUBLICATIONS

"Bridged-Grain Polycrystalline Silicon Thin-Film Transistors" IEEE Transactions on Electron Devices, vol. 60, No. 6, Jun. 2013 p. 1965-1970; Zhao, et al.

*Primary Examiner* — John P Dulka
(74) *Attorney, Agent, or Firm* — Lee & Morse, P.C.

(57) ABSTRACT

A manufacturing method of a thin film transistor of a display device, the method including forming a gate insulating layer on a semiconductor layer; attaching a halftone mask onto the gate insulating layer; forming a channel region including a plurality of bridged grain lines formed; exposing the gate insulating layer of the channel region; forming a gate electrode layer on the halftone mask and the gate insulating layer; forming a gate electrode on the channel region by etching a portion corresponding to a boundary of the channel region of the gate electrode layer; removing the halftone mask; forming source/drain regions; forming an interlayer insulating layer on the gate electrode and the gate insulating layer; forming contact holes by etching the gate insulating layer and the interlayer insulating layer to expose the source/drain regions; and forming source/drain electrodes connected with the source/drain regions through the contact holes.

12 Claims, 7 Drawing Sheets

(51) Int. Cl.
*H01L 29/417* (2006.01)
*H01L 29/423* (2006.01)
*H01L 29/49* (2006.01)
*H01L 21/28* (2006.01)
*H01L 21/32* (2006.01)
*H01L 29/06* (2006.01)
*H01L 29/786* (2006.01)

(56) References Cited

FOREIGN PATENT DOCUMENTS

KR 10-2010-0022979 A 3/2010
KR 10-2011-0040242 A 4/2011

* cited by examiner

MANUFACTURING METHOD OF THIN FILM TRANSISTOR OF DISPLAY DEVICE

CROSS-REFERENCE TO RELATED APPLICATION

Korean Patent Application No. 10-2014-0169126, filed on Nov. 28, 2014, in the Korean Intellectual Property Office, and entitled: "Manufacturing Method of Thin Film Transistor of Display Device," is incorporated by reference herein in its entirety.

BACKGROUND

1. Field

Provided is a manufacturing method of a thin film transistor of a display device.

2. Description of the Related Art

Flat panel displays may include, for example, a liquid crystal display (LCD), a plasma display panel (PDP), an organic light emitting diode (OLED) device, a field effect display (FED), and an electrophoretic display device.

SUMMARY

Embodiments may be realized by providing a manufacturing method of a thin film transistor of a display device, the method including forming a gate insulating layer on a semiconductor layer including a polysilicon layer; attaching a halftone mask formed using a photoresist onto the gate insulating layer; forming a channel region including a plurality of bridged grain lines formed by doping impurities on the semiconductor layer; exposing the gate insulating layer of the channel region by etching a part of the halftone mask; forming a gate electrode layer on the halftone mask and the gate insulating layer; forming a gate electrode on the channel region by etching a portion corresponding to a boundary of the channel region of the gate electrode layer; removing the halftone mask; forming source/drain regions by doping impurities on both sides of the channel region of the semiconductor layer; forming an interlayer insulating layer on the gate electrode and the gate insulating layer; forming contact holes by etching the gate insulating layer and the interlayer insulating layer to expose the source/drain regions; and forming source/drain electrodes connected with the source/drain regions through the contact holes.

The halftone mask may include a partially through-formed region corresponding to the channel region of the semiconductor layer.

Forming the channel region may include forming a plurality of grain lines on the semiconductor layer through the partially through-formed region of the halftone mask.

Forming the channel region may include doping boron (B) on the semiconductor layer.

Intervals between the plurality of grain lines may be 0.3 μm or more and 0.6 μm or less.

The halftone mask may include four to six partially through-formed regions.

The halftone mask may be formed using a reversely tapered photoresist.

Removing the halftone mask may include removing the gate electrode layer from the gate insulating layer using a lift-off method of the halftone mask.

Forming the source/drain regions may include doping boron (B) on the semiconductor layer.

Forming the gate insulating layer may include laminating a material made of silicon nitride ($SiN_x$) or silicon oxide ($SiO_2$).

Forming the interlayer insulating layer may include laminating a material made of silicon nitride ($SiN_x$) or silicon oxide ($SiO_2$).

The display device may be an organic light emitting diode device.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It is noted that the drawings are schematic and not illustrated according to a scale. Relative dimensions and ratios of portions in the drawings may be exaggerated or reduced in sizes for clarity and convenience in the drawings. In addition, in like structures, elements, or components illustrated in two or more drawings, like reference numerals are used in order to represent similar features. It will be understood that when an element such as a layer, film, region, or substrate is referred to as being "on" another element, it can be directly on the other element or intervening elements may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

The exemplary embodiment represents an exemplary embodiment in detail. As a result, various modifications in the drawings are expected. Therefore, the exemplary embodiment is not limited to a specific form of an illustrated region, and for example, includes modifications of a manufactured form.

Hereinafter, a manufacturing method of a thin film transistor of a display device according to an exemplary embodiment will be described in detail with reference to FIGS. 1 and 2A to 2I.

Figure 1:
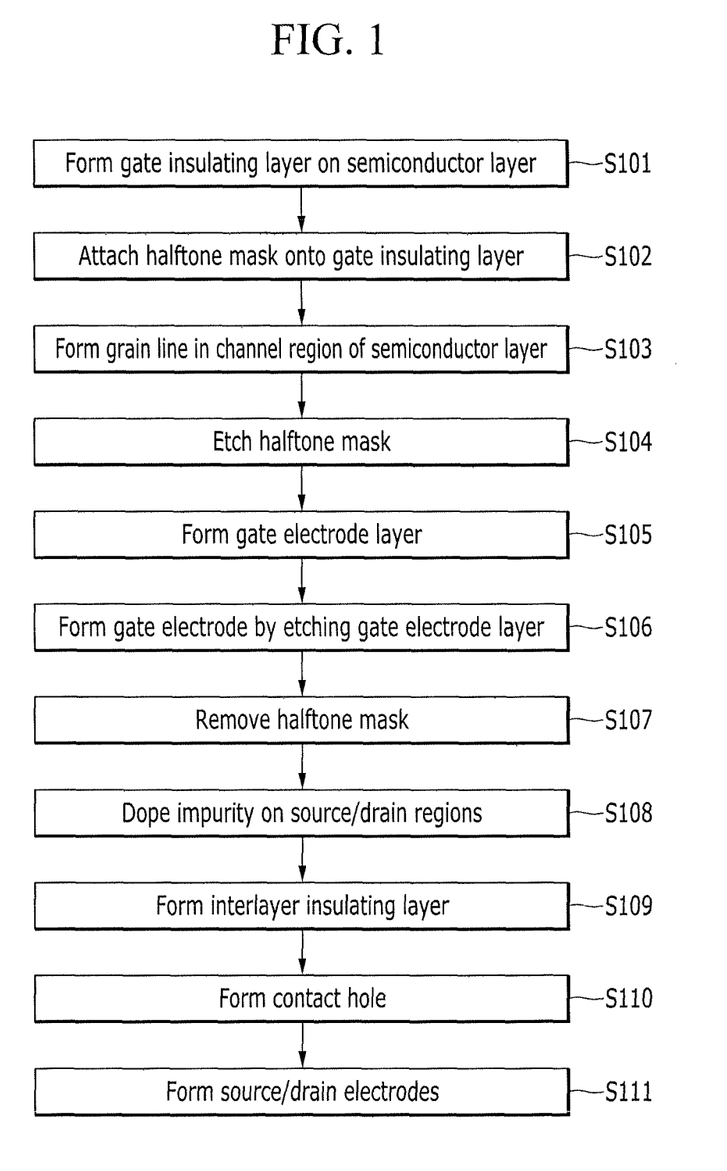
FIG. 1 illustrates a flowchart of a manufacturing method of a thin film transistor of a display device according to an exemplary embodiment.

FIG. 1 illustrates a flowchart of a manufacturing method of a thin film transistor of a display device according to an exemplary embodiment, and FIGS. 2A to 2I illustrate sequential process diagrams of the manufacturing method of the thin film transistor of the display device according to the exemplary embodiment. First, referring to FIG. 2A, a semiconductor layer 40 that may be formed as, e.g., that may include, a polysilicon layer may be prepared, and a gate insulating layer 50 may be formed on the semiconductor layer (S101). The gate insulating layer 50 may be made of, for example, silicon nitride (SiN$_x$) or silicon oxide (SiO$_2$), and a gate electrode that may be formed below and the semiconductor layer 40 may be insulated.

Figure 2A:
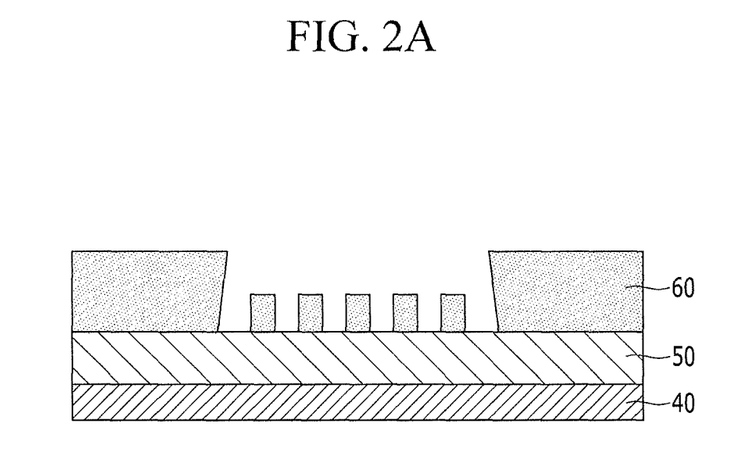
FIGS. 2A to 2I illustrate sequential process diagrams of the manufacturing method of the thin film transistor of the display device according to the exemplary embodiment.

After forming the gate insulating layer 50 (S101), a halftone mask 60 with a pattern may be attached onto the gate insulating layer 50 (S102). The halftone mask 60 may have a partially through-formed region, and a plurality of grain lines 42 may be formed on the semiconductor layer 40 through the through-formed region. The through-formed regions of the halftone mask 60 may be configured by four or more and six or less, e.g., the halftone mask 60 may include four to six through-formed regions. At least four or more grain lines 42 may be formed in the channel region 10 in the thin film transistor element, and may provide element uniformity and a low leakage-current characteristic, e.g., the halftone mask may include a partially through-formed region corresponding to the channel region of the semiconductor layer.

The halftone mask 60 may be formed by, e.g., using, a photoresist and may have a reversely tapered shape. The halftone mask 60 may be formed by the reversely tapered photoresist, and the gate pattern may not be maximally influenced when the halftone mask 60 is removed thereafter.

Figure 2B:
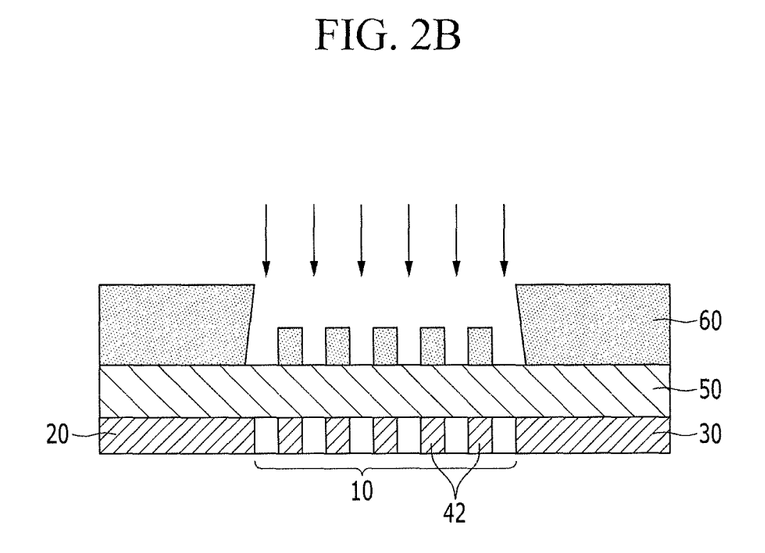

Thereafter, as illustrated in FIG. 2B, the channel region 10 with the plurality of bridged grain lines 42 may be formed by doping an impurity on the semiconductor layer from the top of the halftone mask 60 (S103). The impurity may pass through the partially through-formed region of the halftone mask 60, and the grain line 42 may be formed. In the operation of forming the channel region 10, a P type impurity such as boron (B) may be doped, for example, B$_2$H$_6$ may be used. The impurity may vary according to the thin film transistor, e.g., a kind of thin film transistor. Intervals among, e.g., between, the plurality of grain lines 42 may be 0.3 μm or more and 0.6 μm or less. While a high-temperature process is performed, the intervals among the grain lines 42 may be, e.g., may be formed in, 0.3 μm or more, and an increase of a leakage current and deterioration of element reliability which may be caused when impurities injected with ions are laterally diffused may be prevented. An interval which is as small as a grain size of the polysilicon layer may be maintained to help reduce barriers and traps existing in a grain boundary, and to help remove a grain size effect, the intervals among the grain lines 42 may be formed in 0.6 μm or less.

Figure 2C:
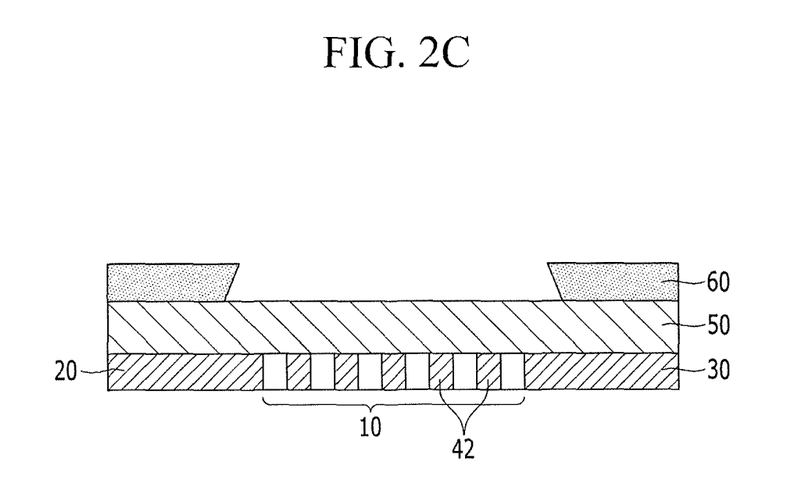
Figure 2D:
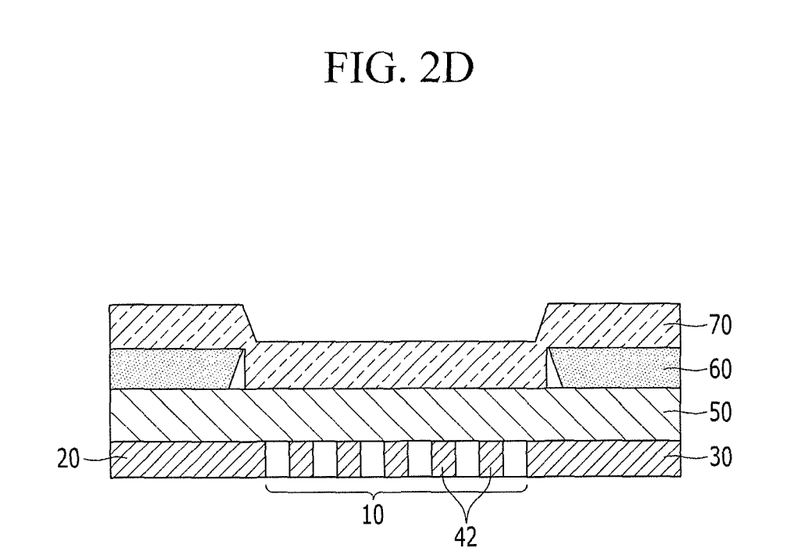

Thereafter, as illustrated in FIG. 2C, an upper portion of the halftone mask 60 may be partially etched to expose the gate insulating layer 50 of the channel region 10 (S104), and as illustrated in FIG. 2D, a gate electrode layer 70 may be formed on the gate insulating layer 50 and the halftone mask 60 (S105). The gate electrode layer 70 may be laminated on the gate insulating layer 50 corresponding to the channel region 10 and the halftone mask 60 corresponding to the source region 20 and the drain region 30 in a continuous form, and the gate electrode layer 70 may be etched to remain as the gate electrode 74.

Figure 2E:
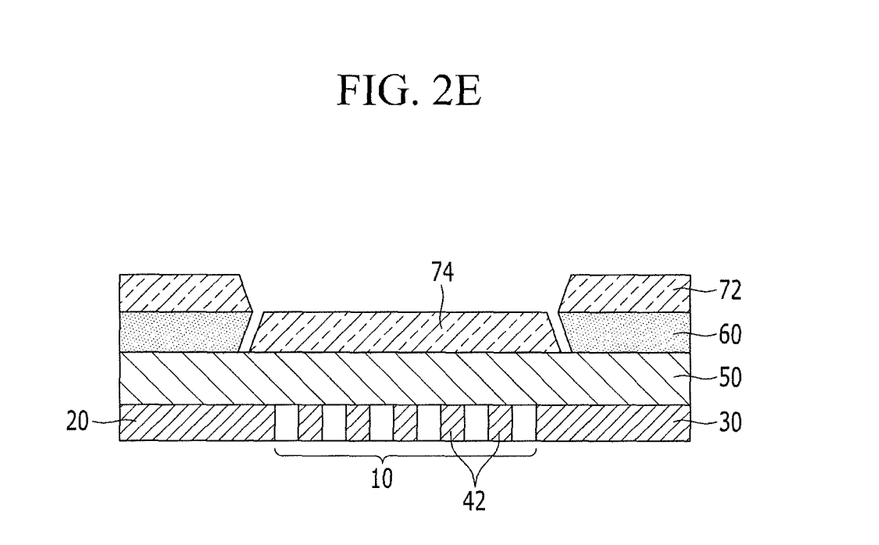

Thereafter, as illustrated in FIG. 2E, to form the gate electrode layer 70 so as to exist only on the channel region 10 of the semiconductor layer, both sides corresponding to the boundary of the channel region 10 of the gate electrode layer 70 may be etched (S106). Accordingly, the gate electrode layer 72 on the halftone mask 60 and the gate electrode layer 74 on the gate insulating layer 50 may be separated from each other.

Figure 2F:
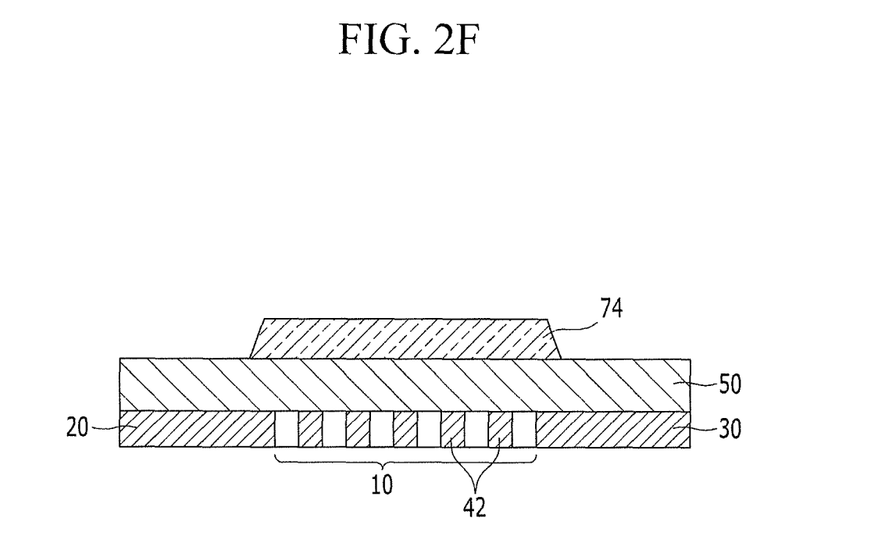

Thereafter, as illustrated in FIG. 2F, the halftone mask 60 may be removed (S107). In the gate electrode layer 70 on the gate insulating layer 50, a portion corresponding to the channel region 10 of the semiconductor layer may remain to become the gate electrode 74. The halftone mask 60 may remove the gate electrode layer 70 from the gate insulating layer 50 by using a lift-off method. The halftone mask 60 may directly contact the gate insulating layer 50 and may be weakly absorbed to the gate insulating layer 50, and may be removed by the lift-off method.

Figure 2G:
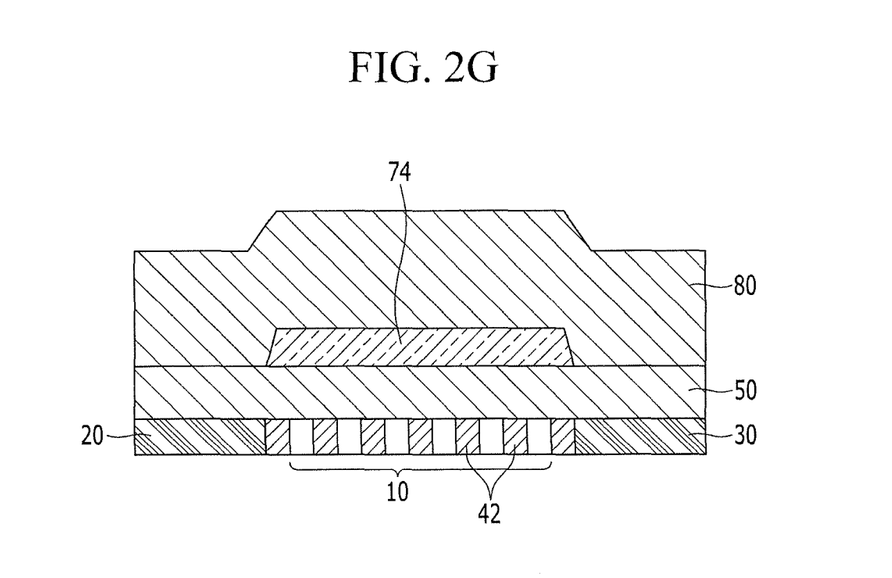

Thereafter, as illustrated in FIG. 2G, impurities may be doped on both sides of the channel region 10 of the semiconductor layer to form the source/drain regions 20 and 30 (S108), e.g., the gate electrode 74 may serve as mask for the channel region 10 and the plurality of grain lines 42 in the formation of the source/drain regions 20 and 30. As illustrated in FIG. 2G, the channel region 10 may not include the remaining portions of semiconductor layer 40 contacting source/drain regions 20 and 30, e.g., the portions of semiconductor layer 40 masked by the outer edges of the gate electrode 74 during the formation of the source/drain regions 20 and 30. Thereafter, an interlayer insulating layer 80 may be formed on the gate electrode 74 and the gate insulating layer 50 (S109).

The source/drain regions 20 and 30 may include the source region 20 and the drain region 30 formed to be p+ doped on both sides of the channel region 10. A doped ion material may be a P type impurity such as boron (B) or B$_2$H$_6$. The impurity may vary according to a kind of thin film transistor.

The interlayer insulating layer 80 may be formed on the gate electrode 74 and the gate insulating layer 50. The interlayer insulating layer 80 may be formed by using a ceramic-based material such as silicon nitride (SiN$_x$) or silicon oxide (SiO$_2$), like the gate insulating layer 50.

Figure 2H:
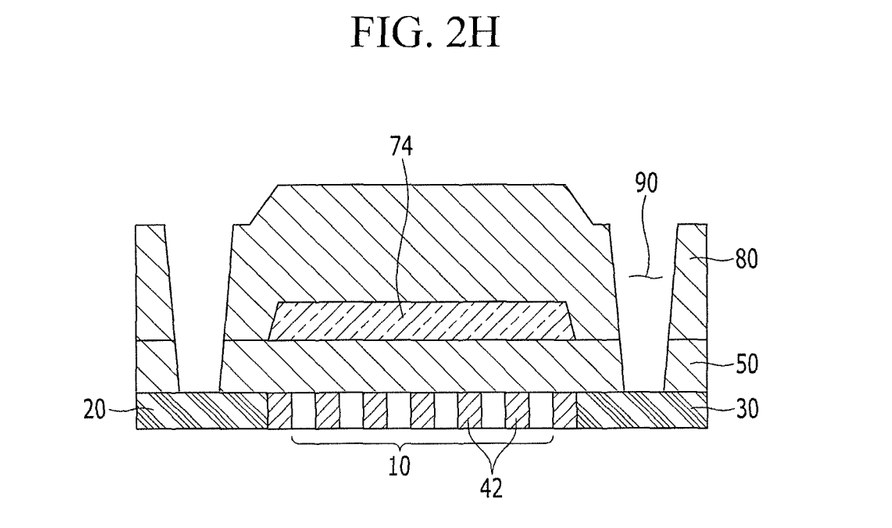

Thereafter, as illustrated in FIG. 2H, the source/drain regions 20 and 30 may be exposed by etching the gate insulating layer 50 and the interlayer insulating layer 80 to form a contact hole (through-hole) 90 (S110). The gate insulating layer 50 and the interlayer insulating layer 80 may have contact holes 90 exposing the source/drain regions 20 and 30 of the semiconductor layer.

Figure 2I:
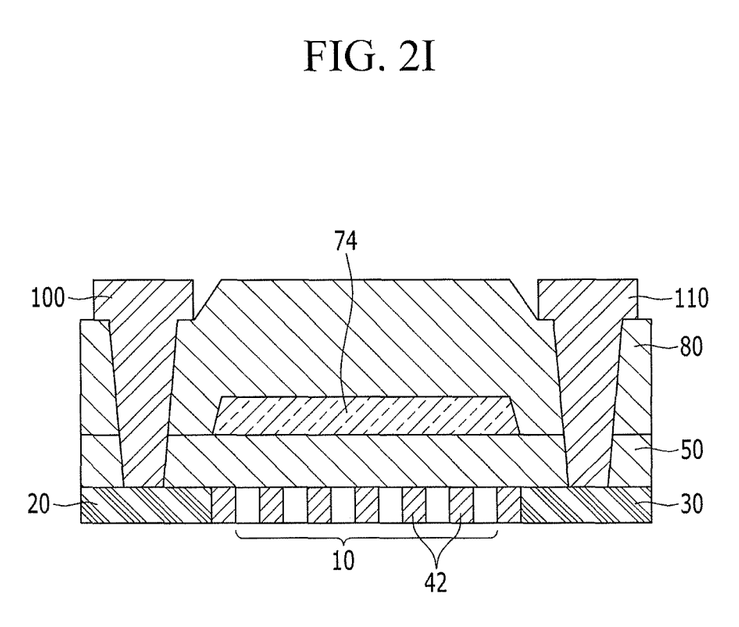

Thereafter, as illustrated in FIG. 2I, source/drain electrodes 100 and 110 connected with the source/drain regions 20 and 30 through the contact holes 90 may be formed (S111). The source/drain electrodes 100 and 110 may be connected with, e.g., to, the source/drain regions 20 and 30 of the semiconductor layer through the contact holes 90 formed in the interlayer insulating layer 80 and the gate insulating layer 50.

The thin film transistor including the semiconductor layer 40, the gate electrode 74, and the source/drain electrodes 100 and 110 may be formed. The configuration of the thin film transistor may be variously modified by those skilled in the art.

The aforementioned display device may be an organic light emitting diode display device.

Although not illustrated, a planarization layer covering the source/drain electrodes 100 and 110 may be formed on the interlayer insulating layer 80. The planarization layer may eliminate a planarization operation to enhance light emission efficiency of an organic light emitting diode to be formed thereon.

A pixel defining layer including first electrodes of the organic light emitting diode and having openings exposing the first electrodes may be formed on the planarization layer. An organic emission layer may be formed on the first electrode, and a second electrode may be formed on the organic emission layer. The organic light emitting diode including the first electrode, the organic emission layer, and the second electrode may be formed.

By way of summation and review, an OLED device may include two electrodes and an OLED positioned therebetween, and may emit light when an electron injected from a cathode, which is one electrode, and a hole injected from an anode, which is the other electrode, are coupled with each other in an organic emission member to form an exciton and the exciton discharges energy. A display substrate of the OLED device may include a switching thin film transistor, a driving thin film transistor, and a capacitor which may be formed for each pixel, respectively.

Figure 3:
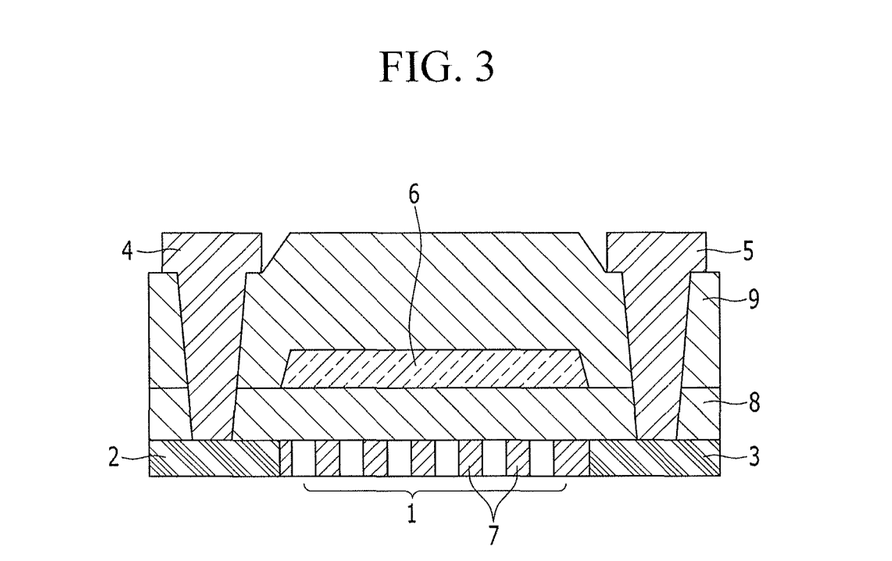
FIG. 3 illustrates a diagram schematically of a thin film transistor of a display device manufactured by a comparative manufacturing method.
Figure 4:
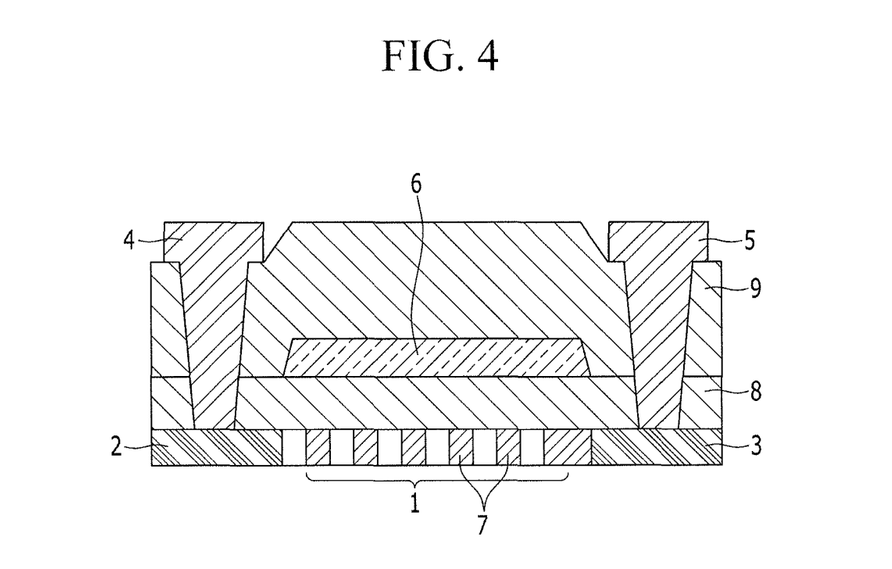
FIG. 4 illustrates a diagram schematically of a thin film transistor of a display device manufactured by a comparative manufacturing method.

The driving thin film transistor may apply driving power for emitting light of an organic emission layer of the OLED, for example, in a selected pixel, and as illustrated in FIGS. 3 and 4, a semiconductor layer formed as a polysilicon layer may be formed on a buffer layer (not illustrated) on the display substrate (not illustrated). The semiconductor layer may include a channel region 1 on which an impurity may not be doped, and a source region 2 and a drain region 3 formed at both sides of the channel region 1, on which p+ impurities may be doped.

A gate insulating layer 8 may be formed on the semiconductor layer. A gate wire including a gate electrode 6 may be formed on the gate insulating layer 8, and the gate wire may further include a gate line, a capacitor plate, and other wires. The gate electrode 6 may be formed to overlap with at least a part of the semiconductor layer, for example, the channel region 1.

An interlayer insulating layer (passivation layer) 9 covering the gate electrode 6 may be formed on the gate insulating layer 8. The gate insulating layer 8 and the interlayer insulating layer 9 may have through-holes (contact holes) exposing the source region 2 and the drain region 3 of the semiconductor layer.

On the interlayer insulating layer 9, a data wire including a source electrode 4 and a drain electrode 5 may be formed. The data wire may further include a data line, a common power line, a second capacitor plate, and other wires. The source electrode 4 and the drain electrode 5 may be connected with the source region 2 and the drain region 3 of the semiconductor layer through the through-holes formed in the interlayer insulating layer 9 and the gate insulating layer 8, respectively.

The driving thin film transistor including the semiconductor layer, the gate electrode 6, the source electrode 2, and the drain electrode 3 may be formed.

A bridged-grained line (BG-line) 7 on which boron may be doped may be formed in the channel region 1 of the semiconductor layer, and to help provide uniformity of the devices and a low leakage-current characteristic, at least four or more BG-lines may be required. Forming the grain line may include sequentially laminating a photoresist on the semiconductor layer, doping boron in the channel region of the semiconductor layer, laminating the gate insulating layer, and then forming the gate electrode. As illustrated in FIGS. 3 and 4, the BG-lines may be misaligned, the grain line may be not checked by the naked eye, and it may be difficult to check a position in the channel region and alignment with the gate electrode.

When the grain line is misaligned, a distance between the drain region and the grain line may not coincide with a distance between the source region and the grain line. When the degree of the misalignment is increased, the number of grain lines in the channel may vary, a characteristic of the thin film transistor may be deteriorated, and a characteristic for each thin film transistor may be different, and the reliability of the thin film transistor may be deteriorated.

Provided is a manufacturing method of a thin film transistor of a display device that may improve compatibility of the thin film transistor having a bridged grain structure, e.g., of a bridged grain line by using a halftone mask.

By the manufacturing method of the thin film transistor of the display device according to an exemplary embodiment, it may be possible to improve a characteristic and the reliability of the thin film transistor by improving compatibility between the gate electrode and the bridged grain line in the channel region. It may be possible to efficiently remove a photoresist without maximally influencing a gate pattern by using a reversely tapered photoresist.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A manufacturing method of a thin film transistor of a display device, the method comprising:
   forming a gate insulating layer on a semiconductor layer including a polysilicon layer;
   attaching a halftone mask formed using a photoresist onto the gate insulating layer;
   forming a channel region including a plurality of bridged grain lines formed by doping impurities on the semiconductor layer;
   exposing the gate insulating layer of the channel region by etching a part of the halftone mask;
   forming a gate electrode layer on the halftone mask and the gate insulating layer;
   forming a gate electrode on the channel region by etching a portion corresponding to a boundary of the channel region of the gate electrode layer;
   removing the halftone mask;
   forming source/drain regions by doping impurities on both sides of the channel region of the semiconductor layer;
   forming an interlayer insulating layer on the gate electrode and the gate insulating layer;
   forming contact holes by etching the gate insulating layer and the interlayer insulating layer to expose the source/drain regions; and
   forming source/drain electrodes connected with the source/drain regions through the contact holes.

2. The manufacturing method as claimed in claim 1, wherein the halftone mask includes a partially through-formed region corresponding to the channel region of the semiconductor layer.

3. The manufacturing method as claimed in claim 1, wherein forming the channel region includes forming a plurality of grain lines on the semiconductor layer through the partially through-formed region of the halftone mask.

4. The manufacturing method as claimed in claim 1, wherein forming the channel region includes doping boron (B) on the semiconductor layer.

5. The manufacturing method as claimed in claim 1, wherein intervals between the plurality of grain lines are 0.3 µm or more and 0.6 µm or less.

6. The manufacturing method as claimed in claim 1, wherein the halftone mask includes four to six partially through-formed regions.

7. The manufacturing method as claimed in claim 1, wherein the halftone mask is formed using a reversely tapered photoresist.

8. The manufacturing method as claimed in claim 1, wherein removing the halftone mask includes removing the gate electrode layer from the gate insulating layer using a lift-off method of the halftone mask.

9. The manufacturing method as claimed in claim 1, wherein forming the source/drain regions includes doping boron (B) on the semiconductor layer.

10. The manufacturing method as claimed in claim 1, wherein forming the gate insulating layer includes laminating a material made of silicon nitride ($SiN_x$) or silicon oxide ($SiO_2$).

11. The manufacturing method as claimed in claim 1, wherein forming the interlayer insulating layer includes laminating a material made of silicon nitride ($SiN_x$) or silicon oxide ($SiO_2$).

12. The manufacturing method as claimed in claim 1, wherein the display device is an organic light emitting diode device.

* * * * *